US011695250B2

(12) United States Patent
Möhrle et al.

(10) Patent No.: US 11,695,250 B2
(45) Date of Patent: Jul. 4, 2023

(54) THERMALLY TUNABLE LASER AND METHOD FOR FABRICATING SUCH LASER

(71) Applicant: Fraunhofer-Gesellschaft zur Förderung der angewandten Forschung e.V., Munich (DE)

(72) Inventors: Martin Möhrle, Berlin (DE); Moon-Hyeok Lee, Berlin (DE)

(73) Assignee: Fraunhofer—Gesellschaft zur F rderung der angewandten Forschung e.V., M nchen (DE)

( * ) Notice: Subject to any disclaimer, the term of this patent is extended or adjusted under 35 U.S.C. 154(b) by 38 days.

(21) Appl. No.: 17/076,173

(22) Filed: Oct. 21, 2020

(65) Prior Publication Data

US 2021/0036482 A1 Feb. 4, 2021

Related U.S. Application Data

(63) Continuation of application No. PCT/EP2019/060787, filed on Apr. 26, 2019.

(30) Foreign Application Priority Data

Apr. 30, 2018 (EP) .................................. 18170115

(51) Int. Cl.
*H01S 5/024* (2006.01)
*H01S 5/02* (2006.01)
(Continued)

(52) U.S. Cl.
CPC ........ *H01S 5/02469* (2013.01); *H01S 5/0207* (2013.01); *H01S 5/02461* (2013.01);
(Continued)

(58) Field of Classification Search
CPC .............. H01S 5/02461; H01S 5/0612; H01S 5/06255; H01S 5/06256; H01S 5/0207; H01S 5/02476–02492; H01S 5/12–125
See application file for complete search history.

(56) References Cited

U.S. PATENT DOCUMENTS 6,727,598 B2 4/2004 Choa
8,236,590 B2 * 8/2012 Matsui .................. B82Y 20/00
438/31
(Continued)

FOREIGN PATENT DOCUMENTS

EP 1699120 A2 9/2006
JP H0936274 A * 2/1997
(Continued)

OTHER PUBLICATIONS

"Amplify." Merriam-Webster.com Thesaurus, Merriam-Webster, https://www.merriam-webster.com/thesaurus/amplify. Accessed Nov. 30, 2022. (Year: 2022).*
(Continued)

*Primary Examiner* — Joshua King
(74) *Attorney, Agent, or Firm* — NKL Law; Jae Youn Kim

(57) ABSTRACT

A thermally tunable laser includes: a substrate; a laser resonator, wherein the laser resonator includes a gain section, and wherein the laser resonator includes a tuning section; a heating arrangement; a heat sink arrangement for dissipating a heat flow from the laser resonator to the heat sink arrangement; and a hole arrangement for influencing the heat flow from the laser resonator to the heat sink arrangement, wherein the hole arrangement is arranged between the substrate and the heat sink arrangement, wherein one or more holes of the hole arrangement include at least one hole being arranged within a horizontal range of
(Continued)

the tuning section, so that a thermal resistance between the tuning section and the heat sink arrangement is increased.

14 Claims, 4 Drawing Sheets

(51) Int. Cl.
*H01S 5/06* (2006.01)
*H01S 5/0625* (2006.01)
*H01S 5/12* (2021.01)
*H01S 5/125* (2006.01)

(52) U.S. Cl.
CPC ........ *H01S 5/02476* (2013.01); *H01S 5/0612* (2013.01); *H01S 5/06255* (2013.01); *H01S 5/06256* (2013.01); *H01S 5/125* (2013.01); *H01S 5/1209* (2013.01); *H01S 5/1218* (2013.01)

(56) References Cited

U.S. PATENT DOCUMENTS

| | | | | |
|---|---|---|---|---|
| 9,054,482 | B1* | 6/2015 | Li | H01S 3/0405 |
| 2003/0006225 | A1* | 1/2003 | Choa | H01S 5/06256 |
| | | | | 219/494 |
| 2003/0025976 | A1* | 2/2003 | Wipiejewski | G02F 1/0147 |
| | | | | 359/240 |
| 2005/0169566 | A1* | 8/2005 | Takahashi | G02F 1/011 |
| | | | | 385/1 |
| 2008/0008217 | A1* | 1/2008 | Miller | H01S 5/024 |
| | | | | 372/36 |
| 2008/0187018 | A1* | 8/2008 | Li | H01L 21/02538 |
| | | | | 372/50.11 |
| 2009/0074020 | A1* | 3/2009 | Matsui | H01S 5/026 |
| | | | | 438/32 |
| 2009/0296762 | A1* | 12/2009 | Yamaguchi | H01L 24/06 |
| | | | | 359/197.1 |
| 2010/0311195 | A1* | 12/2010 | Matsui | B82Y 20/00 |
| | | | | 438/31 |
| 2013/0058371 | A1* | 3/2013 | Yoneda | B82Y 20/00 |
| | | | | 372/50.11 |
| 2014/0010248 | A1* | 1/2014 | Larson | H01S 5/02461 |
| | | | | 372/20 |
| 2014/0321488 | A1* | 10/2014 | Chen | H01S 5/02461 |
| | | | | 438/694 |
| 2016/0071963 | A1* | 3/2016 | Chan | H01L 29/7824 |
| | | | | 438/421 |
| 2017/0194764 | A1* | 7/2017 | Evans | G02F 1/2255 |
| 2017/0207603 | A1 | 7/2017 | Evans et al. | |
| 2018/0205199 | A1* | 7/2018 | Kwon | H01S 5/02461 |
| 2020/0295533 | A1* | 9/2020 | Bachmann | H01S 5/0237 |
| 2021/0273409 | A1* | 9/2021 | Tao | H01S 5/34306 |

FOREIGN PATENT DOCUMENTS

| | | | | |
|---|---|---|---|---|
| WO | WO-2017161886 A1 * | 9/2017 | ......... | H01S 5/02461 |
| WO | 2018/060729 A1 | 4/2018 | | |
| WO | WO-2018060729 A1 * | 4/2018 | ......... | G02B 6/12002 |
| WO | WO-2018205579 A1 * | 11/2018 | ............. | H01S 3/081 |

OTHER PUBLICATIONS

"Amplify." Merriam-Webster.com Dictionary, Merriam-Webster, https://www.merriam-webster.com/dictionary/amplify. Accessed Nov. 30, 2022. (Year: 2022).*

J. Buss et al.: "Tunable Laser Diode and Related Optical Sources", second edition, SPIE Press Book, pp. 73-75 and Chapter 6.

T. Kameda et al.: "A DBR Laser Employing Passive-Section Heaters, with 10.8 nm Tuning Range and 1.6 MHz Linewidth", IEEE Photon. Technol. Lett. vol. 5, No. 6 (1993) pp. 608-610.

B. Mason et al.: "InP Based Photonic Integrated Circuits for DWDM Optical Communication", The 25th International Conference on Indium Phosphide and Related Materials, WeD2-1 (2013).

M. C. Larson et al.: "Narrow linewidth high power thermally tuned sampled-grating distributed Bragg reflector laser", Optical Fiber Communication Conference and Exposition and the National Fiber Optic Engineers Conference(OFC/NFOEC), OTh31.4 (2013).

H. Ishii et al.: "Narrow Spectral Linewidth Under Wavelength Tuning in Thermally Tunable Super-Structure-Grating (SSG) DBR Lasers", IEEE J. SeL Topics Quantum Electron., vol. 1, No. 2 (1995) pp. 401-407.

* cited by examiner

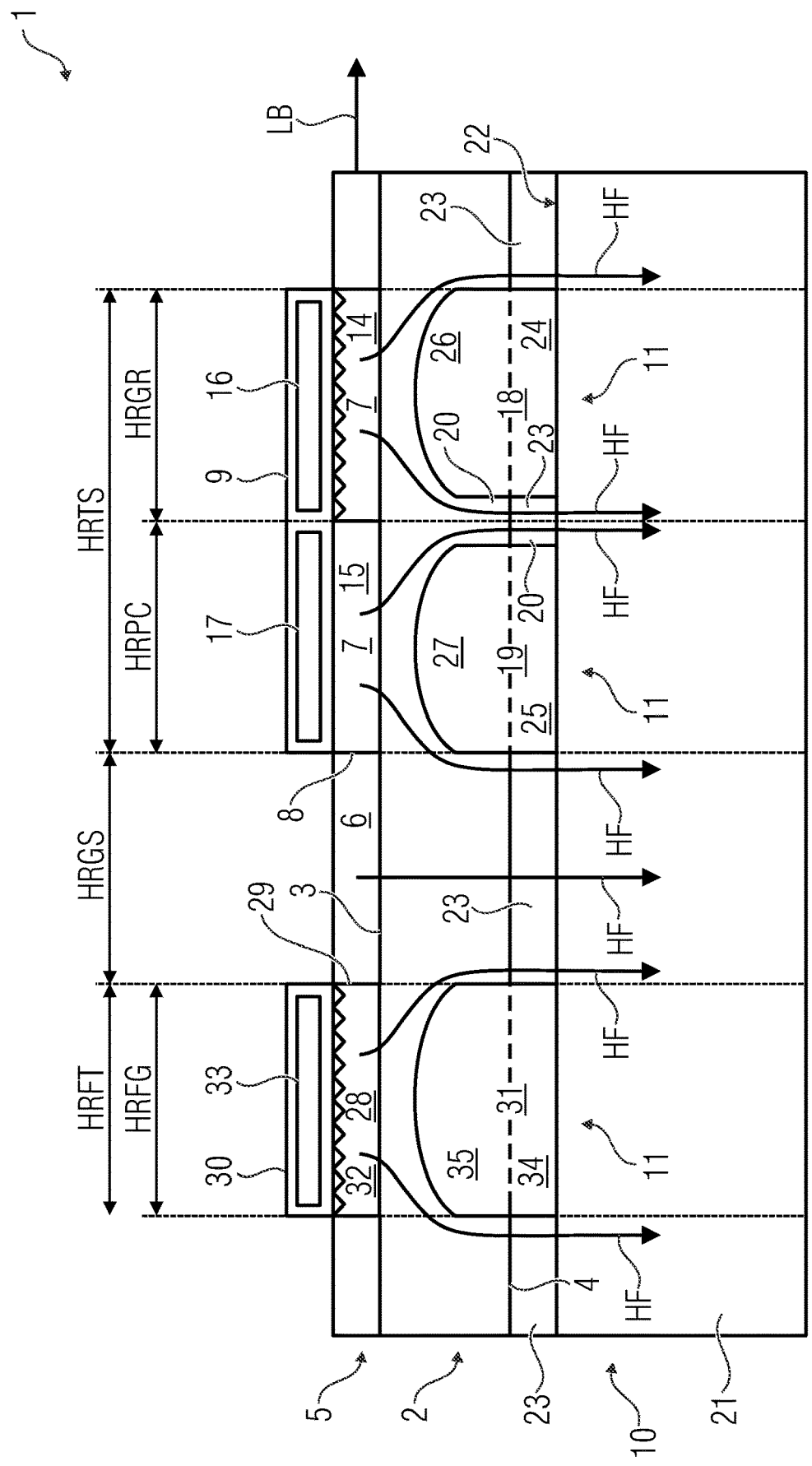

THERMALLY TUNABLE LASER AND METHOD FOR FABRICATING SUCH LASER

CROSS-REFERENCE TO RELATED APPLICATIONS

This application is a continuation of copending International Application No. PCT/EP2019/060787, filed Apr. 26, 2019, which is incorporated herein by reference in its entirety, and additionally claims priority from European Application No. EP 18170115.2, filed Apr. 30, 2018, which is incorporated herein by reference in its entirety.

The invention relates to tunable lasers, in particular to thermally tunable lasers, which have a tunable wavelength.

BACKGROUND OF THE INVENTION

For laser applications involving a tunable wavelength, such as wavelength-division multiplexing (WDM) applications, tunable lasers have a significant advantage of cost effectiveness by replacing an array of many fixed-wavelength lasers. Tunable lasers can provide a small feature size for WDM and ease the replacement.

To control the wavelength shift of the laser, current injection is widely used to change the refractive index of cavity structure. For example, it varies the Bragg's wavelength of a distributed Bragg reflector (DBR) or the effective length of a cavity to shift the lasing wavelength. However, this electrical tuning method gives rise to additional losses and shot noise induced by the injected current, which degrades the spectral linewidth [1.1] and both effects are critical disadvantages for WDM system.

A thermal tuning method is one way to overcome the linewidth broadening because it is free from shot noise induced by current injection. By using a thin-film metal heater on the passive section of lasers (phase and DBR section), researchers demonstrated up to 10 nm tuning range with a narrow linewidth [1.2].

Widely tunable lasers use thermal tuning to get a narrow linewidth, for example, sampled grating (SG) DBR lasers [1.3, 1.4] and super-structure-grating (SSG) DBR lasers [1.5].

However, this thermal tuning as described in [5] is not very efficient because of the high power consumption needed for the tuning as the thermal flow directly passes from the heater through the waveguide and the substrate to the underlying heat sink. Consequently a big part of the generated heat is lost to the heat sink.

By using laser resonators having a suspended waveguide structure, the efficiency of thermal tuning can be significantly increased by disposing a thermally insulating layer between waveguide and substrate. In suspended waveguide structures the direct thermal flow towards the substrate and heat sink is blocked, instead the heat flow goes laterally only. Therefore, here the thermal tuning is much more efficient [1.3, 1.4].

To realize such suspended waveguides, complex and, therefore, complicated fabrication processes are needed [1.6, 1.7]. For the separation between waveguide and substrate, sacrificial layers and protection layers may be used and additional dry and wet etch processing steps are also needed. These sacrificial layers serve to achieve an empty space between waveguide and substrate, and the protection layer prevents the wet etchant solution from damaging other layers of the laser structure. Additional dry etch processes create vias for the wet etch process for removal of the sacrificial layer.

In contrast to this, [1.8] introduces a simple method to block/reduce the direct thermal flow to the heat sink by isolating the DBR and phase part from the heat sink. In this approach, the bottom of the tunable laser (substrate side) is covered by a thermally conductive material (gain part of the tunable laser) and a thermally insulating material (DBR and phase part of the tunable laser). However, this method needs two different wafer backside deposition processes for the conductive and insulating material. Disadvantage of this concept is that the distance between the thermal isolation and the heated waveguide is too large, so no efficient heat flow blocking is possible here.

SUMMARY

According to an embodiment, a thermally tunable laser may have: a substrate having an upper side and a lower side; a laser resonator for producing a laser emission having a horizontal direction, wherein the laser resonator is arranged at the upper side of the substrate, wherein the laser resonator has a gain section for producing light for the laser emission, and wherein the laser resonator has a tuning section for tuning a wavelength of the laser emission, wherein the tuning section is arranged at an horizontal end of the gain section; a heating arrangement for heating the tuning section; a heat sink arrangement for dissipating a heat flow from the laser resonator to the heat sink arrangement, wherein the heat sink arrangement is arranged at the lower side of the substrate; and a hole arrangement for influencing the heat flow from the laser resonator to the heat sink arrangement, wherein the hole arrangement is arranged between the substrate and the heat sink arrangement, wherein one or more holes of the hole arrangement have at least one hole being arranged within a horizontal range of the tuning section, so that a thermal resistance between the tuning section and the heat sink arrangement is increased; wherein the one or more holes of the hole arrangement have at least one hole having a recess within the substrate.

According to another embodiment, a method for fabricating a thermally tunable laser may have the steps of: providing a substrate having an upper side and a lower side; arranging, at the upper side of the substrate, a laser resonator for producing a laser emission having a horizontal direction, wherein the laser resonator has a gain section for producing light for the laser emission, and wherein the laser resonator has a tuning section for tuning a wavelength of the laser emission, wherein the tuning section is arranged at an horizontal end of the gain section; arranging a heating arrangement for heating the tuning section; arranging, at the lower side of the substrate, a heat sink arrangement for dissipating a heat flow from the laser resonator to the heat sink arrangement; and arranging, between the substrate and the heat sink arrangement, a hole arrangement for influencing the heat flow from the laser resonator to the heat sink arrangement, wherein at least one hole of one or more holes of the hole arrangement is arranged within a horizontal range of the tuning section, so that a thermal resistance between the tuning section and the heat sink arrangement is increased, wherein the one or more holes of the hole arrangement have at least one hole having a recess within the substrate.

Terms which express spatial orientations or relationships, like "upper", "lower" and "horizontal", refer to a spatial orientation of the tunable laser, in which the substrate is orientated parallel to the Earth's surface and in which the laser resonator is facing away from the Earth's surface.

The substrate may be, in particular, a substantially plate-shaped layer made of indium phosphide (InP) or gallium arsenide (GaAs).

The laser resonator may be a structure made from indium gallium arsenide (InGaAs) as described, for example, in [1.4]. The tuning mechanism of the tuning section may be based on a change of the reflection index of the material of the tuning section when the temperature of the material is changed.

The heating arrangement may be, in particular, an electrical heating arrangement. The heating arrangement may comprise, in particular, electrically heated thin-film microheaters.

The heat sink arrangement is thermally connected to the lower side of the substrate, so that heat, which is generated in the gain section, when the laser is operated, as well as heat, which is generated in the tuning section, and the wavelength is tuned, may be dissipated in order to avoid overheating of the laser resonator.

The horizontal range of the tuning section is defined by the shape of the horizontal range in the top view.

Some or all of the holes of the hole arrangement may be completely located within the horizontal range of the tuning section. However, it's also possible that some or all of the holes of the hole arrangement are only partially located within the tuning section, so that a portion of some or all of the holes is located outside of the horizontal range of the tuning section.

The hole arrangement is arranged in such way that the heat flow from the laser resonator to the heat sink arrangement, compared to a thermally tunable laser without an hole arrangement between the substrate and the heat sink arrangement, is influenced in such way that a thermal resistance between the tuning section and the heat sink arrangement is increased. By such features the heat loss in the tuning section is reduced when the tuning section is heated by the heating arrangement. This is, because the holes of the hole arrangement are filled with a gaseous material, usually with ambient air, which transports less heat than solid materials typically used for the substrate or used for the heat sink arrangement.

In particular, the one or more holes of the hole arrangement reduce or block a solely vertical heat flow from the heating arrangement via the tuning section to the hole arrangement, so that a higher temperature may be achieved in the tuning section with the same amount of heating energy or enough of that so that a certain temperature may be achieved in the tuning section with a lower amount of heating energy.

As a result, the efficiency of the thermally tuned laser according to the invention is increased compared to a thermally tuned laser without any installation between the laser resonator and the heat sink arrangement.

Furthermore, the hole arrangement may be produced in a simple way by structuring the lower surface of the substrate and/or the upper surface of the heat sink arrangement before or during the heat sink arrangement is formed at the substrate and/or before or during the heat sink arrangement is mounted to the substrate.

The thermally tunable laser according to the invention does not require suspended waveguide structures. Complex and complicated fabrication processes for suspended waveguide structures may be avoided. Thus, the thermally tunable laser according to invention may be produced more cost-effective than a thermally tunable laser having suspended waveguide structures.

Moreover, the thermally tunable laser according to the invention does not require a layer consisting of thermally conducting portions and thermally insulating portions at the lower side of the substrate. Thus, deposition of thermally conducting materials and deposition of thermally insulating layers at the lower side of the substrate may be avoided. As a result the thermally tunable laser according to the invention may be fabricated more cost-effective than a thermally tunable laser having a layer consisting of thermally conducting portions and thermally insulating portions at lower side of the substrate.

The invention may be applied to:
tunable multi-section DBR-lasers;
tunable multi-section SG and/or SSG-lasers;
tunable ring-type and interferometric lasers;
tunable Y-lasers;
tunable lasers with grating-assisted codirectional coupled sampled grating reflector (GCSR) lasers;
tunable digital supermode DBR (DS DBR) lasers;
tunable arrays of lasers;
lasers with tunable phase shifters;
lasers with thermally operated optical switches;
lasers with tunable Mach-Zehnder Interferometers;
lasers with tunable power splitters;
lasers with tunable polarisation splitters;
laser with tunable grating couplers;
above listed lasers using ridge-waveguide structure;
above listed lasers using buried-heterostructure; and
above listed lasers integrated in photonic integrated circuits.

According to an advantageous embodiment of the invention, the one or more holes of the hole arrangement comprise at least one hole comprising a recess within the substrate. In some embodiments the recess or recesses in the substrate may be formed by etching, in particular by wet etching, using a lithography mask at the lower surface of the substrate, before the heat sink arrangement is mounted to the lower surface of the substrate.

An advantage of such embodiments is that any heat sink arrangement having a flat upper surface can be used underneath the substrate, because the heat flow influencing feature is directly integrated into the substrate. Furthermore no additional insulating material has to be deposited on the lower side of the substrate.

By forming a recess in the substrate the heat storage capacity of the substrate may be reduced so that the temperature of the tuning section may be changed more dynamically. For that purpose, some or all of the holes of the hole arrangement may extend until directly underneath the laser resonator.

The depth of the recess or the recesses within the substrate can be controlled by either the etching time or the use of integrated etch stop layers underneath the laser resonator.

According to an advantageous embodiment of the invention, the tuning section comprises a grating section, in particular for controlling the wavelength of the laser emission, and a phase section, in particular for controlling a phase response of the tuning section.

According to an advantageous embodiment of the invention the heating arrangement comprises a first heating member for heating the grating section and a second heating member for heating the phase section. By these features the grating section and the phase section may be independently controlled by the heating arrangement.

According to an advantageous embodiment of the invention the one or more holes of the hole arrangement comprise a hole, which is arranged within a horizontal range of the grating section, so that a thermal resistance between the grating section and the heat sink arrangement is increased, wherein the one or more holes of the hole arrangement comprise a hole, which is arranged within a horizontal range of the phase section, so that a thermal resistance between the phase section and the heat sink arrangement is increased, and wherein the hole, which is arranged within the horizontal range of the grating section, and the hole, which is arranged within the horizontal range of the phase section are separated by a thermally conducting connection between the substrate and the heat sink arrangement.

By these features an unwanted heat flow from the first heating member for heating the grating section to the phase section as well as an unwanted heat flow from the second heating member for heating the face control section to the grating section may be reduced as such heat flows are directed by the thermally conducting connection directed to the heat sink.

The horizontal range of the grating section is defined by the shape of the grating section in the top view.

Some or all of the holes being arranged within the horizontal range of the grating section may be completely located within the horizontal range of the grating section. However, it's also possible that some or all of the holes being arranged within the horizontal range of the grating section are only partially located within the grating section, so that a portion of some or all of that holes is located outside of the horizontal range of the grating section.

The horizontal range of the phase section is defined by the shape of the phase section in the top view.

Some or all of the holes being arranged within the horizontal range of the phase section may be completely located within the horizontal range of the phase section. However, it's also possible that some or all of the holes being arranged within the horizontal range of the phase section are only partially located within the grating section, so that a portion of some or all of the holes is located outside of the horizontal range of the grating section.

According to an advantageous embodiment of the invention, the heat sink arrangement comprises a heat sink member having a flat upper surface. Such heat sink member may be easily produced from metal and is very cost-effective. Such heat sink member may be directly mounted to a substrate comprising the hole arrangement or to a portion of the heat sink arrangement comprising at least a part of the heat sink arrangement, such as a heat spreading layer formed at the lower side of the substrate.

According to an advantageous embodiment of the invention, the heat sink arrangement comprises a heat spreading layer thermally connecting the substrate and the heat sink member. Such heat spreading layer may consist of e.g. aluminum nitride, diamond or silicon. Such heat spreading layer may enhance heat flow from the substrate to the heat sink member between the holes of the hole arrangement.

According to an advantageous embodiment of the invention the one or more holes of the hole arrangement comprise at least one hole comprising a recess within the heat sink arrangement.

According to an advantageous embodiment of the invention the heat sink arrangement comprises a heat sink member having a flat upper surface, wherein the heat sink arrangement comprises a heat spreading layer thermally connecting the substrate and the heat sink member, and wherein the one or more holes of the hole arrangement comprises at least one hole comprising a recess within the heat spreading layer of the heat sink arrangement.

In some embodiments in a first step the heat spreading layer may be formed over the fully area of the lower side of the substrate. After this, in a second step, the recess or recesses in the heat spreading layer may be formed by etching, in particular by wet etching, using a lithography mask at the lower surface of the substrate, before the heat sink member is mounted to the lower surface of the heat spreading layer.

Some embodiments may have an additional third step between the second step and the mounting of the heat sink member, in which one or more recesses are etched, in particular wet etched, adjacent to the recess or the recesses of the heat spreading layer into the substrate. In such embodiments some or all of the holes of the hole arrangement may consist of a recess in the substrate and a recess in the heat spreading layer.

The depth of the recess or the recesses within the substrate can be controlled by either the etching time or the use of integrated etch stop layers underneath the laser resonator.

The most important advantage of such embodiments is the simple fabrication process, as only one lithography step, a subsequent etch step for the metal layer followed by semiconductor etching step is needed for fabricating the hole arrangement.

According to an advantageous embodiment of the invention the one or more holes of the hole arrangement comprise a hole being arranged within a horizontal range of the grating section and within a horizontal range of the phase section, so that a thermal resistance between the grating section and the and a thermal resistance between the phase section and the heat sink arrangement are increased. In this embodiment only one hole may be used to avoid a solely vertical heat flow from the grating section and from the phase section to the heat sink arrangement, so that this embodiment is very easy to fabricate.

According to an advantageous embodiment of the invention the laser resonator comprises a further tuning section for tuning the wavelength of the laser emission, wherein the further tuning section is arranged at a further horizontal end of the gain section, so that the gain section is arranged between the gain section and the further gain section, wherein a further heating arrangement is configured for heating the further tuning section, wherein the one or more holes of the hole arrangement comprise at least one hole being arranged within a horizontal range of the further tuning section, so that a thermal resistance between the further tuning section and the heat sink arrangement is increased. By these features the invention is applied to thermally tunable lasers which have a tuning section at a first horizontal end of the gain section and a further tuning section at a second horizontal end of the gain section.

According to an advantageous embodiment of the invention the further tuning section comprises a further grating section, in particular for controlling the wavelength of the laser emission.

According to an advantageous embodiment of the invention the further heating arrangement comprises a further heating member for heating the further grating section.

According to an advantageous embodiment of the invention the one or more holes of the hole arrangement comprise a hole being arranged within a horizontal range of the further grating section, so that a thermal resistance between the further grating section and the heating arrangement is increased.

In a further aspect the invention provides a method for fabricating a thermally tunable laser, the method comprising the steps:

providing a substrate having an upper side and a lower side;

arranging, at the upper side of the substrate, a laser resonator for producing a laser emission having a horizontal direction, wherein the laser resonator comprises a gain section for producing light for the laser emission, and wherein the laser resonator comprises a tuning section for tuning a wavelength of the laser emission, wherein the tuning section is arranged at an horizontal end of the gain section;

arranging a heating arrangement for heating the tuning section;

arranging, at the lower side of the substrate, a heat sink arrangement for dissipating a heat flow from the laser resonator to the heat sink arrangement; and arranging, between the substrate and the heat sink arrangement, a hole arrangement for influencing the heat flow from the laser resonator to the heat sink arrangement, wherein at least one hole of the hole arrangement is arranged within a horizontal range of the tuning section, so that a thermal resistance between the tuning section and the heat sink arrangement is increased.

BRIEF DESCRIPTION OF THE DRAWINGS

Embodiments of the present invention will be detailed subsequently referring to the appended drawings, in which:

FIG. 4 illustrates a third embodiment of a thermally tunable laser according to the invention in a schematic cross-sectional side view.

DETAILED DESCRIPTION OF THE INVENTION

Figure 1:
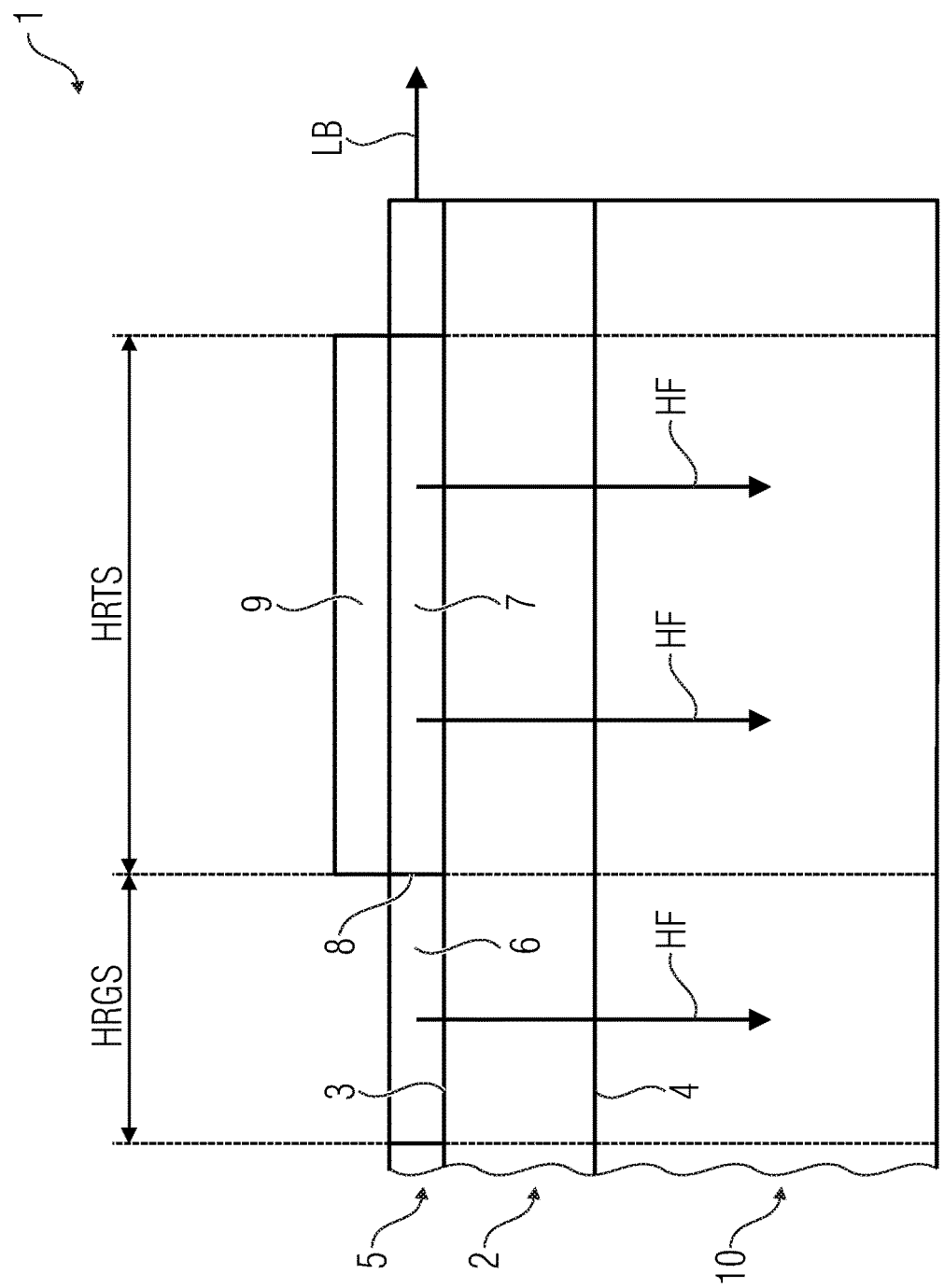
FIG. 1 illustrates an embodiment of a thermally tunable laser according to conventional technology in a schematic cross-sectional side view.

Equal or equivalent elements or elements with equal or equivalent functionality are denoted in the following description by equal or equivalent reference numerals.

In the following description, a plurality of details is set forth to provide a more thorough explanation of embodiments of the present disclosure. However, it will be apparent to those skilled in the art that embodiments of the present disclosure may be practiced without these specific details. In other instances, well-known structures and devices are shown in block diagram form rather than in detail in order to avoid obscuring embodiments of the present disclosure. In addition, features of the different embodiments described hereinafter may be combined with each other, unless specifically noted otherwise.

FIG. 1 illustrates an embodiment of a thermally tunable laser 1 according to conventional technology in a schematic cross-sectional side view. The thermally tunable laser 1 comprises: a substrate 2 having an upper side 3 and a lower side 4; a laser resonator 5 for producing a laser emission LB having a horizontal direction, wherein the laser resonator 5 is arranged at the upper side 3 of the substrate 2, wherein the laser resonator 5 comprises a gain section 6 for producing light for the laser beam LB, and wherein the laser resonator 5 comprises a tuning section 7 for tuning a wavelength of the laser emission LB, wherein the tuning section 7 is arranged at an horizontal end 8 of the gain section 6; a heating arrangement 9 for heating the tuning section 7; and a heat sink arrangement 10 for dissipating a heat flow HF from the laser resonator 5 to the heat sink arrangement 10, wherein the heat sink arrangement 10 is arranged at the lower side 4 of the substrate 2.

Obviously the portion of the heat flow HF generated by the heating arrangement 9 goes directly through the tuning section 7 to the heat sink arrangement 10. As a consequence the tuning efficiency of the thermally tunable laser 1 according to conventional technology is quite low.

Figure 2:
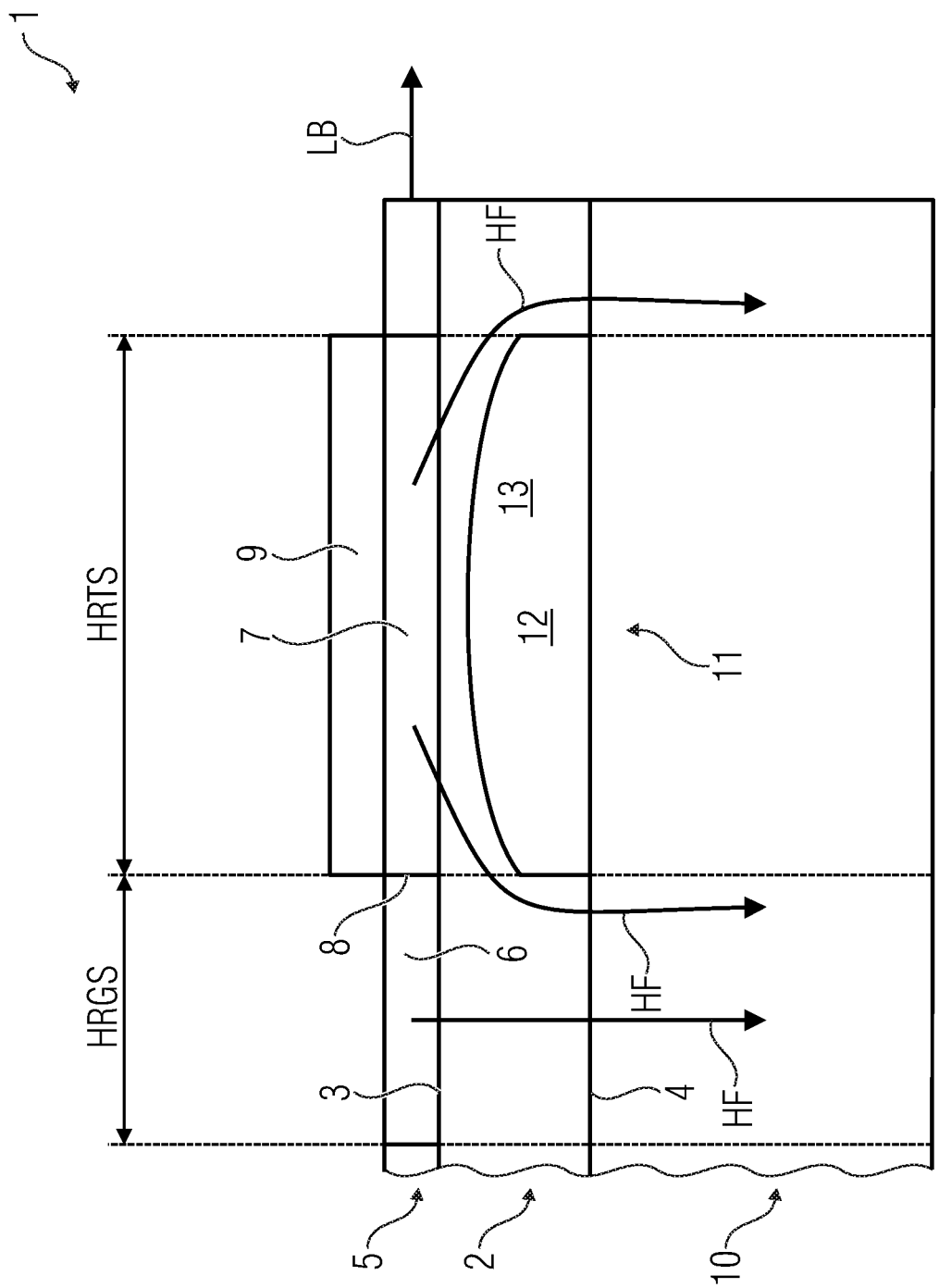
FIG. 2 illustrates a first embodiment of a thermally tunable laser according to the invention in a schematic cross-sectional side view.

FIG. 2 illustrates a first embodiment of a thermally tunable laser 1 according to the invention in a schematic cross-sectional side view. The thermally tunable laser 1 comprises:

a substrate 2 having an upper side 3 and a lower side 4;

a laser resonator 5 for producing a laser emission LB having a horizontal direction, wherein the laser resonator 5 is arranged at the upper side 3 of the substrate 2, wherein the laser resonator 5 comprises a gain section 6 for producing light for the laser beam LB, and wherein the laser resonator 5 comprises a tuning section 7 for tuning a wavelength of the laser emission LB, wherein the tuning section 7 is arranged at an horizontal end 8 of the gain section 6;

a heating arrangement 9 for heating the tuning section 7;

a heat sink arrangement 10 for dissipating a heat flow HF from the laser resonator 5 to the heat sink arrangement 10, wherein the heat sink arrangement 10 is arranged at the lower side 4 of the substrate 2; and a hole arrangement 11 for influencing the heat flow HF from the laser resonator 5 to the heat sink arrangement 10, wherein the hole arrangement 11 is arranged between the substrate 2 and the heat sink arrangement 10, wherein one or more holes 12 of the hole arrangement 11 comprise at least one hole 12 being arranged within a horizontal range HRTS of the tuning section 7, so that a thermal resistance between the tuning section 7 and the heat sink arrangement 10 is increased.

FIG. 2 shows a cross section of the proposed novel concept for a high efficient thermally tunable laser 1. The thermally tunable laser 1 comprises an hole 12 consisting of a recess 13 etched into the substrate 2 of the thermally tunable laser 1. The hole 12 underneath the tuning section 7 efficiently blocks the direct vertical heat flow HF from the tuning section 7 to the heat sink arrangement 10 as shown in FIG. 1. Instead, the heat flow HF from the tuning section 7 to the heat sink arrangement 10 in FIG. 2 has a horizontal component as the heat flow HF is routed around the hole 12. If need be, the hole 12 may extend until directly underneath the laser resonator 5. Thus, the tuning efficiency can be significantly increased.

At the thermally tunable laser 1 of FIG. 2, suspended waveguide structures at the upper side 3 of the substrate 2, which involve complex fabrication steps, which include additional layer growth and combinations of wet- and dry-etch processes to remove semiconductor material underneath the laser resonator 5, or thermally insulating materials at the lower side 4 of the substrate 2, which involve further disposition steps, are avoided.

According to an advantageous embodiment of the invention, the one or more holes 12 of the hole arrangement 11 comprise at least one hole 12 comprising a recess 13 within the substrate 2.

In a further aspect the invention relates to a method for fabricating a thermally tunable laser 1, the method comprising the steps:

providing a substrate 2 having an upper side 3 and a lower side 4;

arranging, at the upper side 3 of the substrate 2, a laser resonator 5 for producing a laser emission LB having a horizontal direction, wherein the laser resonator 5 comprises a gain section 6 for producing light for the laser emission LB, and wherein the laser resonator 5 comprises a tuning section 7 for tuning a wavelength of the laser emission LB, wherein the tuning section 7 is arranged at an horizontal end 8 of the gain section 6;

arranging a heating arrangement 9 for heating the tuning section 7;

arranging, at the lower side 4 of the substrate 2, a heat sink arrangement 10 for dissipating a heat flow HF from the laser resonator 5 to the heat sink arrangement 10; and arranging, between the substrate 2 and the heat sink arrangement 10, a hole arrangement 11 for influencing the heat flow HF from the laser resonator 5 to the heat sink arrangement 10, wherein at least one hole 12 of one or more holes 12 of the hole arrangement 11 is arranged within a horizontal range of the tuning section HRTS, so that a thermal resistance between the tuning section 7 and the heat sink arrangement 10 is increased.

Figure 3:
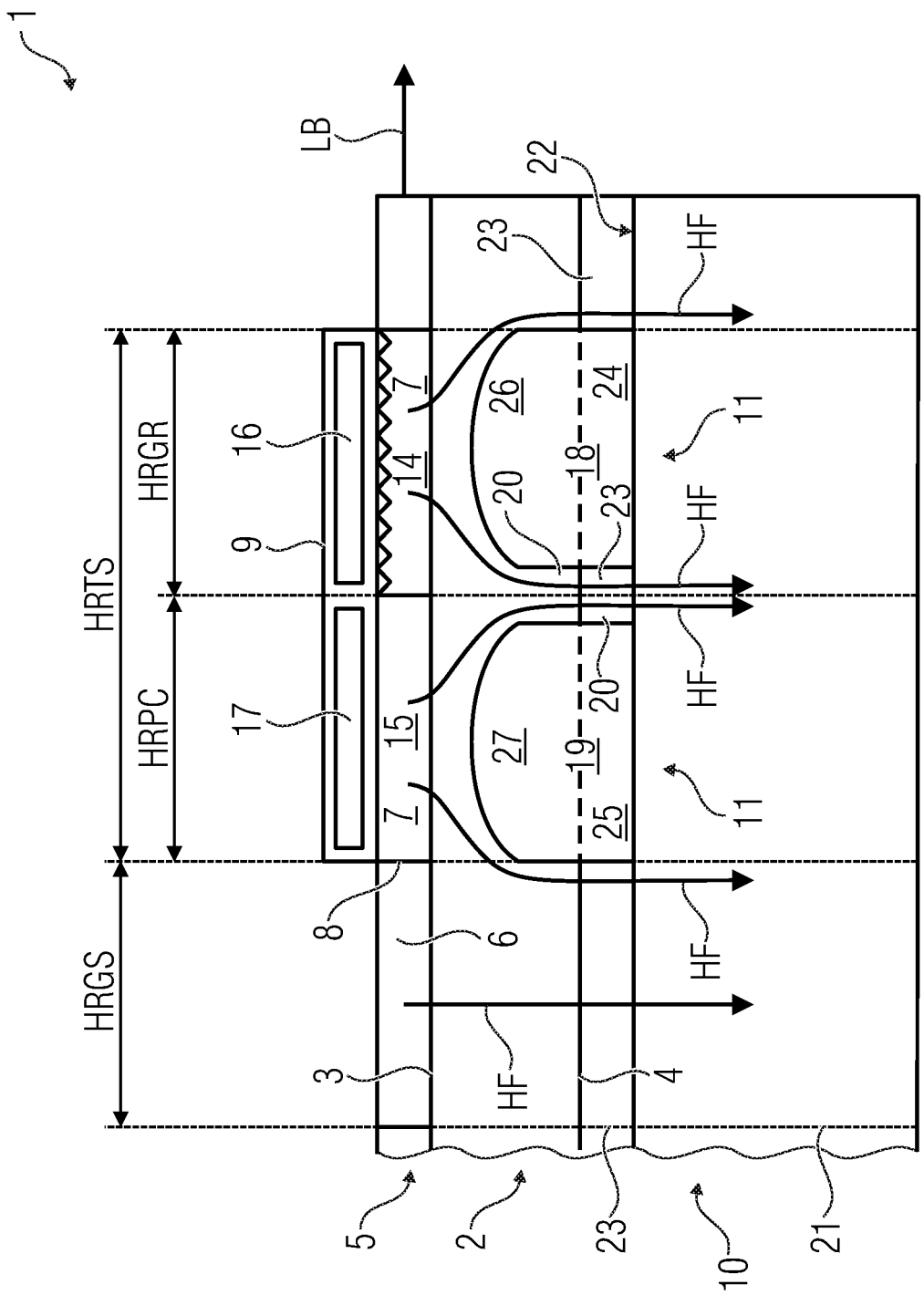
FIG. 3 illustrates a second embodiment of a thermally tunable laser according to the invention in a schematic cross-sectional side view.

FIG. 3 illustrates a second embodiment of a thermally tunable laser 1 according to the invention in a schematic cross-sectional side view. The second embodiment is based on the first embodiment so that the following only differences between the first embodiment and the second embodiment are discussed.

According to an advantageous embodiment of the invention, the tuning section 7 comprises a grating section 14, in particular for controlling the wavelength of the laser emission LB, and a phase section 15, in particular for controlling a phase response of the tuning section 7.

The thermally tunable laser 1 of FIG. 3 is an improved 3-section thermally tunable DBR laser 1. However, the same approach can be applied to sampled grating (SG) thermally tunable laser.

According to an advantageous embodiment of the invention, the heating arrangement 9 comprises a first heating member 16 for heating the grating section 14 and a second heating member 17 for heating the phase section 15.

According to an advantageous embodiment of the invention the one or more holes 18, 19 of the hole arrangement 11 comprise a hole 18, which is arranged within a horizontal range HRGR of the grating section 14, so that a thermal resistance between the grating section 14 and the heat sink arrangement 10 is increased, wherein the one or more holes 18, 19 of the hole arrangement 11 comprise a hole 19, which is arranged within a horizontal range HRPC of the phase section 15, so that a thermal resistance between the phase section 15 and the heat sink arrangement 10 is increased, and wherein the hole 18, which is arranged within the horizontal range HRGR of the grating section 14, and the hole 19, which is arranged within the horizontal range HRPC of the phase section 15 are separated by a thermally conducting connection 20 between the substrate 2 and the heat sink arrangement 10.

According to an advantageous embodiment of the invention, the heat sink arrangement 10 comprises a heat sink member 21 having a flat upper surface 22.

According to an advantageous embodiment of the invention, the heat sink arrangement 10 comprises a heat spreading layer 23 thermally connecting the substrate 2 and the heat sink member 21.

According to an advantageous embodiment of the invention, the one or more holes 18, 19 of the hole arrangement 11 comprise at least one hole 18, 19 comprising a recess 26, 27 within the substrate 2.

According to an advantageous embodiment of the invention, the one or more holes 18, 19 of the hole arrangement 11 comprise at least one hole 18, 19 comprising a recess 25, 26 within the heat sink arrangement 10.

In FIG. 3 the hole 18 consists of the recess 24 in the heat sink arrangement 10 and of the recess 26 in the substrate 2. Furthermore, the hole 19 consists of the recess 25 in the heat sink arrangement 10 and of the recess 27 in the substrate 2.

According to an advantageous embodiment of the invention, the heat sink arrangement 10 comprises a heat sink member 21 having a flat upper surface 22, wherein the heat sink arrangement 10 comprises a heat spreading layer 23 thermally connecting the substrate 2 and the heat sink member 21, and wherein the one or more holes 18, 19 of the hole arrangement 11 comprises at least one hole 18, 19 comprising a recess 24, 25 within the heat spreading layer 23 of the heat sink arrangement 10.

According to an advantageous embodiment (not shown) of the invention the one or more holes 18, 19 of the hole arrangement 11 comprise a hole (not shown) being arranged within a horizontal range HRGR of the grating section 14 and within a horizontal range HRPC of the phase section 15, so that a thermal resistance between the grating section 14 and the heat sink arrangement 10 and a thermal resistance between the phase section 15 and the heating arrangement 10 are increased.

FIG. 4 illustrates a third embodiment of a thermally tunable laser 1 according to the invention in a schematic cross-sectional side view. The third embodiment is based on the second embodiment so that the following only differences between the second embodiment and the third embodiment are discussed.

The thermally tunable laser 1 of FIG. 4 is an improved 3-section thermally tunable super-structure-grating (SSG) laser 1.

According to an advantageous embodiment of the invention, the laser resonator 5 comprises a further tuning section 28 for tuning the wavelength of the laser emission LB, wherein the further tuning section 28 is arranged at a further horizontal end 29 of the gain section 6, so that the gain section 6 is arranged between the gain section 7 and the further gain section 28, wherein a further heating arrangement 30 is configured for heating the further tuning section 28, wherein the one or more holes 18, 19, 31 of the hole arrangement 11 comprise at least one hole 31 being arranged within a horizontal range HRFT of the further tuning section 28, so that a thermal resistance between the further tuning section 28 and the heat sink arrangement 10 is increased.

According to an advantageous embodiment of the invention, the further tuning section 28 comprises a further grating section 32, in particular for controlling the wavelength of the laser emission.

According to an advantageous embodiment of the invention, the further heating arrangement 30 comprises a further heating member 33 for heating the further grating section 32.

According to an advantageous embodiment of the invention, the one or more holes of 18, 19, 31 the hole arrangement comprise a hole 31 being arranged within a horizontal range HRFG of the further grating section 32, so that a thermal resistance between the further grating section 32 and the heating arrangement 10 is increased.

According to an advantageous embodiment of the invention, the one or more holes 18, 19, 31 of the hole arrangement 11 comprise at least one hole 18, 19, 31 comprising a recess 26, 27, 35 within the substrate 2.

According to an advantageous embodiment of the invention, the one or more holes 18, 19, 31 of the hole arrangement 11 comprise at least one hole 18, 19, 31 comprising a recess 25, 26, 34 within the heat sink arrangement 10.

In FIG. 4 the hole 18 consists of the recess 24 in the heat sink arrangement 10 and of the recess 26 in the substrate 2. The hole 19 consists of the recess 25 in the heat sink arrangement 10 and of the recess 27 in the substrate 2. Furthermore, the hole 31 consists of the recess 34 in the heat sink arrangement 10 and of the recess 35 in the substrate 2.

According to an advantageous embodiment of the invention the heat sink arrangement 10 comprises a heat sink member 21 having a flat upper surface 22, wherein the heat sink arrangement 10 comprises a heat spreading layer 23 thermally connecting the substrate 2 and the heat sink member 21, and wherein the one or more holes 18, 19, 31 of the hole arrangement 11 comprises at least one hole 18, 19, 31 comprising a recess 24, 25, 34 within the heat spreading layer 23 of the heat sink arrangement 10.

All thermally tunable laser devices focusing on thermal tuning are possible applications of the inventive concept. Not only 3-section DBR and SG/SSG DBR lasers as mentioned above, but also distributed-feedback lasers (DFB), fabry-perot lasers, ring type and interferometer type lasers would be good applications. Furthermore, SG lasers, SSG lasers, ring resonator lasers, interferometer type lasers, Y-lasers, grating-assisted codirectional coupled sampled grating reflector (GCSR) lasers, tunable twin guide lasers (TIG), digital supermode DBR (DS DBR) lasers and array of DBR or DFB lasers.

Laser variants with integrated thermally tunable phase shifters, such as e.g. modulators, filters and optical switches or lasers with integrated grating couplers can also use this concept Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

REFERENCES

[1.1] J. Buss et al., "Tunable Laser Diode and Related Optical Sources", second edition, SPIE PRESS BOOK, pp. 73-75 and Chapter 6 (2005).
[1.2] T. Kameda et al., "A DBR Laser Employing Passive-Section Heaters, with 10.8 nm Tuning Range and 1.6 MHz Linewidth", IEEE Photonics Technology Letters, Vol. 5, No. 6 pp. 608-610(1993).
[1.3] B. Mason et al., "InP Based Photonic Integrated Circuits For DWDM Optical Communication", The 25th International Conference on Indium Phosphide and Related Materials, WeD2-1 (2013).
[1.4] M. C. Larson et al., "Narrow linewidth high power thermally tuned sampled-grating distributed Bragg reflector laser", Optical Fiber Communication Conference and Exposition and the National Fiber Optic Engineers Conference (OFC/NFOEC), OTh31.4 (2013).
[1.5] H. Ishii et al., "Narrow Spectral Linewidth Under Wavelength Tuning in Thermally Tunable Super-Structure-Grating (SSG) DBR Lasers", IEEE Journal of Selected Topics in Quantum Electronics, Vol. 1, No. 2 pp. 401-407 (1995).
[1.6] Y. Matsui et al., "DBR Laser With Improved, Tuning Efficiency", U.S. Pat. No. 8,236,590 B2 (2012).
[1.7] H. Chen et al., "Tunable Laser with High Thermal Wavelength Tuning Efficiency", Patent Application US 2014/0321488 A1 (2014).
[1.8] F.-S. Choa, "Thermally Tunable System", U.S. Pat. No. 6,727,598 B2 (2004).

The invention claimed is:

1. A thermally tunable laser comprising:
a substrate comprising an upper side and a lower side;
a laser resonator for producing a laser emission having a horizontal direction, wherein the laser resonator is arranged at the upper side of the substrate, wherein the laser resonator comprises a gain section for producing light for the laser emission, and wherein the laser resonator comprises a tuning section for tuning a wavelength of the laser emission, wherein the tuning section is arranged at an horizontal end of the gain section;
a heating arrangement for heating the tuning section;
a heat sink arrangement for dissipating a heat flow from the laser resonator to the heat sink arrangement, wherein the heat sink arrangement is arranged at the lower side of the substrate; and
a hole arrangement for influencing the heat flow from the laser resonator to the heat sink arrangement, wherein the hole arrangement is arranged between the substrate and the heat sink arrangement, wherein one or more holes of the hole arrangement comprise at least one hole being arranged within a horizontal range of the tuning section, so that a thermal resistance between the tuning section and the heat sink arrangement is increased,
wherein the at least one hole being arranged within the horizontal range of the tuning section comprises a recess within the substrate, the recess is configured to have a curved surface such that the heat flow from the laser resonator is routed around the curved surface of the recess and reaches the heat sink arrangement, and
wherein the heat sink arrangement is thermally connected to the laser resonator, seen in the horizontal direction, on both sides of the at least one hole being arranged within the horizontal range of the tuning section.

2. The thermally tunable laser according to claim 1, wherein the tuning section comprises a grating section and a phase section.

3. The thermally tunable laser according to claim 2, wherein the heating arrangement comprises a first heating member for heating the grating section and a second heating member for heating the phase section.

4. The thermally tunable laser according to claim 2, wherein the one or more holes of the hole arrangement comprise a hole, which is arranged within a horizontal range of the grating section, so that a thermal resistance between the grating section and the heat sink arrangement is increased, wherein the one or more holes of the hole arrangement comprise a hole, which is arranged within a horizontal range of the phase section, so that a thermal resistance between the phase section and the heat sink arrangement is increased, and wherein the hole, which is arranged within the horizontal range of the grating section, and the hole, which is arranged within the horizontal range of the phase section are separated by a thermally conducting connection between the substrate and the heat sink arrangement.

5. The thermally tunable laser according to claim 1, wherein the heat sink arrangement comprises a heat sink member comprising a flat upper surface.

6. The thermally tunable laser according to claim 1, wherein the heat sink arrangement comprises a heat spreading layer thermally connecting the substrate and the heat sink member.

7. The thermally tunable laser according to claim 1, wherein the one or more holes of the hole arrangement comprise at least one hole comprising the recess within the heat sink arrangement.

8. The thermally tunable laser according to claim 1, wherein the heat sink arrangement comprises a heat sink member comprising a flat upper surface, wherein the heat sink arrangement comprises a heat spreading layer thermally connecting the substrate and the heat sink member, and wherein the one or more holes of the hole arrangement comprises at least one hole comprising the recess within the heat spreading layer of the heat sink arrangement.

9. The thermally tunable laser according to claim 2, wherein the one or more holes of the hole arrangement comprise a hole being arranged within a horizontal range of the grating section and within a horizontal range of the phase section, so that a thermal resistance between the grating section and the heat sink arrangement and a thermal resistance between the phase section and the heating arrangement are increased.

10. The thermally tunable laser according to claim 1, wherein the laser resonator comprises a further tuning section for tuning the wavelength of the laser emission, wherein the further tuning section is arranged at a further horizontal end of the gain section, so that the gain section is arranged between the tuning section and the further tuning section, and wherein the thermally tunable laser comprises a further heating arrangement configured for heating the further tuning section, wherein the one or more holes of the hole arrangement comprise at least one hole being arranged within a horizontal range of the further tuning section, so that a thermal resistance between the further tuning section and the heat sink arrangement is increased.

11. The thermally tunable laser according to claim 10, wherein the further tuning section comprises a further grating section.

12. The thermally tunable laser according to claim 10, wherein the further heating arrangement comprises a further heating member for heating the further grating section.

13. The thermally tunable laser according to claim 10, wherein the one or more holes of the hole arrangement comprise a hole being arranged within a horizontal range of the further grating section, so that a thermal resistance between the further grating section and the heating arrangement is increased.

14. A method for fabricating a thermally tunable laser, the method comprising:
  providing a substrate comprising an upper side and a lower side;
  arranging, at the upper side of the substrate, a laser resonator for producing a laser emission having a horizontal direction, wherein the laser resonator comprises a gain section for producing light for the laser emission, and wherein the laser resonator comprises a tuning section for tuning a wavelength of the laser emission, wherein the tuning section is arranged at an horizontal end of the gain section;
  arranging a heating arrangement for heating the tuning section;
  arranging, at the lower side of the substrate, a heat sink arrangement for dissipating a heat flow from the laser resonator to the heat sink arrangement; and
  arranging, between the substrate and the heat sink arrangement, a hole arrangement for influencing the heat flow from the laser resonator to the heat sink arrangement, wherein at least one hole of one or more holes of the hole arrangement is arranged within a horizontal range of the tuning section, so that a thermal resistance between the tuning section and the heat sink arrangement is increased, wherein the at least one hole arranged within the horizontal range of the tuning section comprises a recess within the substrate, the recess is configured to have a curved surface such that the heat flow from the laser resonator is routed around the curved surface of the recess and reaches the heat sink arrangement, and wherein the heat sink arrangement is thermally connected to the laser resonator, seen in the horizontal direction, on both sides of the at least one hole being arranged within the horizontal range of the tuning section.

* * * * *

UNITED STATES PATENT AND TRADEMARK OFFICE
CERTIFICATE OF CORRECTION

Page 1 of 1

PATENT NO. : 11,695,250 B2
APPLICATION NO. : 17/076173
DATED : July 4, 2023
INVENTOR(S) : Martin Möhrle and Moon-Hyeok Lee It is certified that error appears in the above-identified patent and that said Letters Patent is hereby corrected as shown below:

On the Title Page

Item (73):
(73) Assignee: Fraunhofer—Gesellschaft zur F
rderung der angewandten Forschung
e.V., M nchen (DE)

Should read:
(73) Assignee: Fraunhofer-Gesellschaft zur
Förderung der angewandten Forschung
e.V., München (DE)

Signed and Sealed this
Twenty-fourth Day of October, 2023

Katherine Kelly Vidal
*Director of the United States Patent and Trademark Office*